US012782010B2

(12) United States Patent
Fertig et al.

(10) Patent No.: US 12,782,010 B2
(45) Date of Patent: Nov. 3, 2026

(54) GENERATING LOCAL CRYOGENIC REGION WITH LASER COOLING TO ENABLE CIRCUIT OPERATION

(71) Applicant: Honeywell International Inc., Charlotte, NC (US)

(72) Inventors: Chad Fertig, Roseville, MN (US); Chad Hoyt, Roseville, MN (US)

(73) Assignee: Honeywell Aerospace US LLC, Phoenix, AZ (US)

(*) Notice: Subject to any disclaimer, the term of this patent is extended or adjusted under 35 U.S.C. 154(b) by 192 days.

(21) Appl. No.: 18/592,263

(22) Filed: Feb. 29, 2024

(65) Prior Publication Data

US 2025/0075950 A1 Mar. 6, 2025

Related U.S. Application Data

(60) Provisional application No. 63/516,410, filed on Jul. 28, 2023.

(51) Int. Cl.

*F25B 23/00* (2006.01)
*H10N 60/83* (2023.01)
*H10N 60/85* (2023.01)

(52) U.S. Cl.

CPC ........... *F25B 23/003* (2013.01); *H10N 60/83* (2023.02); *H10N 60/855* (2023.02)

(58) Field of Classification Search

CPC ...... F25B 23/003; H01N 60/83; H01N 60/84; H01N 60/855

See application file for complete search history.

(56) References Cited

U.S. PATENT DOCUMENTS

| | | | | |
|---|---|---|---|---|
| 6,041,610 | A * | 3/2000 | Edwards | F25B 23/003 62/3.1 |
| 6,378,321 | B1 * | 4/2002 | Epstein | H01S 3/0408 62/3.1 |
| 9,500,519 | B2 | 11/2016 | Tang et al. | |
| 10,620,044 | B2 | 4/2020 | Thompson et al. | |
| 11,506,951 | B2 | 11/2022 | Ram et al. | |

FOREIGN PATENT DOCUMENTS

| | | | |
|---|---|---|---|
| CN | 110057446 | B | 2/2021 |
| CN | 111123430 | B | 10/2021 |
| CN | 113759479 | A | 12/2021 |
| CN | 114061175 | A | 2/2022 |
| CN | 115574484 | A | 1/2023 |
| JP | 6492796 | B2 | 4/2019 |

* cited by examiner

*Primary Examiner* — Joseph F Trpisovsky
(74) *Attorney, Agent, or Firm* — Fogg & Powers LLC

(57) ABSTRACT

A system for optical cooling comprises a substrate and a first waveguide supported by the substrate, with the first waveguide configured to provide optical cooling by fluorescence up-conversion. A first optical fiber is coupled to the first waveguide, with the first optical fiber configured to deliver cooling light to the first waveguide. A second waveguide is supported by the substrate, with the second waveguide adjacent to or coincident with the first waveguide. The interaction of the cooling light with the first waveguide produces a zone of local optical refrigeration based on the fluorescence up-conversion, such that the second waveguide is optically cooled by physical proximity to the first waveguide.

13 Claims, 3 Drawing Sheets

GENERATING LOCAL CRYOGENIC REGION WITH LASER COOLING TO ENABLE CIRCUIT OPERATION

CROSS REFERENCE TO RELATED APPLICATION

This application claims the benefit of and priority to U.S. Provisional Application No. 63/516,410, filed on Jul. 28, 2023, the disclosure of which is herein incorporated by reference.

BACKGROUND

Single photon detectors (SPDs) are used in quantum networks. Superconducting nanowire single photon detectors (SNSPDs), which exhibit high quantum efficiency (QE) across a broad wavelength range, are the current state of the art technology for single photon detectors. The superconducting materials of choice for SNSPDs exhibit a high transition temperature (Tc), relaxing requirements on the cryogenic systems needed to cool them. Niobium nitride (NbN) has an advantageously high Tc of about 7-12 K and can be deposited in thin films directly on top of photonic waveguides using standard lithographic processes. Such SNSPDs feature high quantum efficiency, fast response, and easy photonic integration. Currently, SNSPDs are cooled to below Tc by conventional cryo-coolers using liquid helium in either closed or open loop cycles, making this technology poorly suited for deployment on satellite platforms, which demand low size, weight, and power (SWaP) and long operational lifetimes.

Thus, there is a need for methods of cooling single photon detectors for use in satellites that meet stringent SWAP requirements.

SUMMARY

A system for optical cooling comprises a substrate and a first waveguide supported by the substrate, with the first waveguide configured to provide optical cooling by fluorescence up-conversion. A first optical fiber is coupled to the first waveguide, with the first optical fiber configured to deliver cooling light to the first waveguide. A second waveguide is supported by the substrate, with the second waveguide adjacent to or coincident with the first waveguide. The interaction of the cooling light with the first waveguide produces a zone of local optical refrigeration based on the fluorescence up-conversion, such that the second waveguide is optically cooled by physical proximity to the first waveguide.

BRIEF DESCRIPTION OF THE DRAWINGS

Embodiments of the present invention can be more easily understood and further advantages and uses thereof are more readily apparent, when considered in view of the description of the embodiments and the following figures in which.

DETAILED DESCRIPTION

Figure 1A:
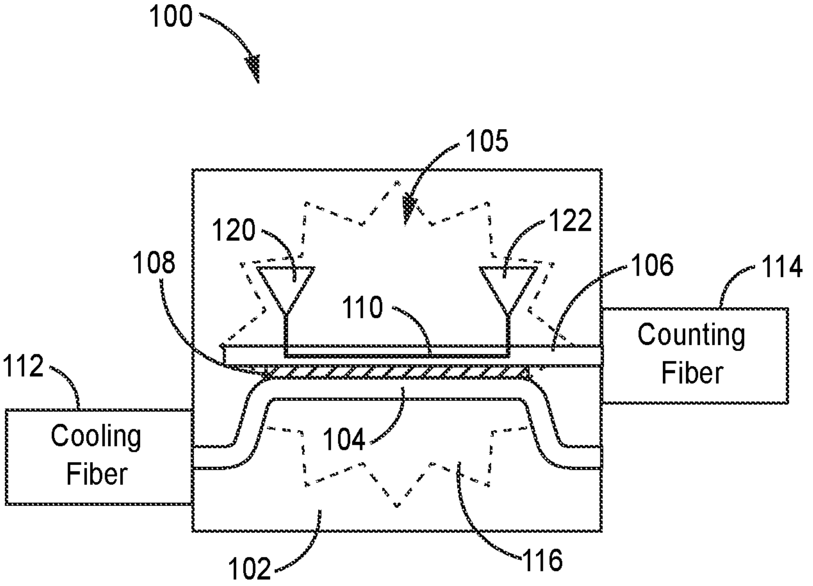
FIG. 1A is a schematic top view of one embodiment of a system for a superconducting nanowire single photon detector (SNSPD) that is configured to use laser cooling to generate a zone of local optical refrigeration.

In the following detailed description, reference is made to the accompanying drawings, in which is shown by way of illustration various exemplary embodiments. It is to be understood that other embodiments may be utilized, and that logical, mechanical and electrical changes may be made without departing from the scope of the invention. The following detailed description is, therefore, not to be taken in a limiting sense.

Systems and methods for generating a zone of optical refrigeration, such as a local cryogenic region, using laser cooling to enable circuit operation, are described herein.

In one implementation, a method for generating a zone of optical refrigeration comprises providing an optical refrigeration circuit in thermal communication with a temperature-dependent circuit. The method activates delivery of a cooling light to a waveguide in the optical refrigeration circuit when a trigger event occurs to create a zone of optical refrigeration for the temperature-dependent circuit. The method deactivates the delivery of the cooling light to the optical refrigeration circuit when the zone of optical refrigeration has a temperature below a user selected threshold. The method operates the temperature-dependent circuit while the temperature for the zone of optical refrigeration is below the user selected threshold.

Various embodiments described herein can use cryogenic photonics, in which direct, local and potentially time pulsed cooling of a potentially microscopic volume around an optical waveguide, is used to enable operation of a circuit. This technique can unlock mass integration of, for example, cryogenic photon detectors in otherwise room temperature photonics. This approach could prove significant in the development of quantum networks and other circuits that benefit from operating at least a portion of their components, intermittently or transiently, at cryogenic temperatures (e.g., below Tc of a material used in the circuit).

Various embodiments provide for directly cooling a nanoscale waveguide in III-V heterostructures on which a superconducting film has been deposited. In one embodiment, a "cooling" waveguide is underneath and in close thermal communication with a "counting" or "utility" waveguide. In this embodiment, the cooling waveguide and the counting waveguide are coupled to optical fibers. In another embodiment, the cooling waveguide is side-by-side with the counting waveguide.

The cooling waveguide can be formed in a thin film material system that supports laser cooling, such as a III-V heterogenous semiconductor material system. The utility waveguide can be formed in a thin film material system that supports transmission of light at a desired wavelength, and may be a different material, or the same material, as the cooling waveguide. In some embodiments, a reflective layer can be located in between the cooling waveguide and the counting waveguide to block photons directed into, or emanating from, the cooling waveguide or its immediately surrounding region, from reaching the counting waveguide or its immediately surrounding region.

In a further embodiment, such as described below with respect to FIG. 2, the functions of the cooling and counting waveguides are implemented with a single waveguide, with one optical fiber configured to deliver cooling light to one end of the waveguide and another optical fiber configured to deliver counting light to the other end of the waveguide. In various embodiments, the cooling operates in a synchronous pulse mode, such as described below with respect to FIGS. 2-4 below. In the single photon counter example, the pulse of cooling light is admitted into the waveguide just prior to the arrival window of a countable photon and is then extinguished (pulsed cooling mode) such that the local temperature of the waveguide is temporarily cooled to below the Tc of the superconducting film and persists at the low temperature for long enough that the single photon is counted.

An appropriate window of time can be determined by a user, and lasts for the duration of cooling light pulse, which can be from microseconds to seconds. The rate at which the counting waveguide cools depends on thermal time constants for the propagation of thermal energy in a substrate that supports the waveguides. Specifically, when the cooling light pulse reduces the temperature of the cooling waveguide, heat energy flows from the surroundings to the substrate immediately surrounding the cooling waveguide. This energy is then extracted from the substrate by the process of optical refrigeration by fluorescence up-conversion. The substrate in the vicinity of the cooling waveguide cools down at a rate related to the rate of heat transport in the substrate. In typical substrates (e.g., silicon, silicon dioxide, etc.), the region around the cooling waveguide will cool down in a matter of microseconds to 100's of microseconds.

Once the cooling light is turned off, the zone of cooling will heat back up to an equilibrium temperature at roughly the same rate as it cooled down, because the rate of heat transport for heating back up is roughly the same as cooling down. Thus, the cooling lasts for as long as the cooling light is applied, and then recovers to the original temperature after approximately 1 microsecond to 100 microseconds after the cooling light is extinguished.

Further details of the various embodiments are described hereafter with reference to the drawings.

Figure 1B:
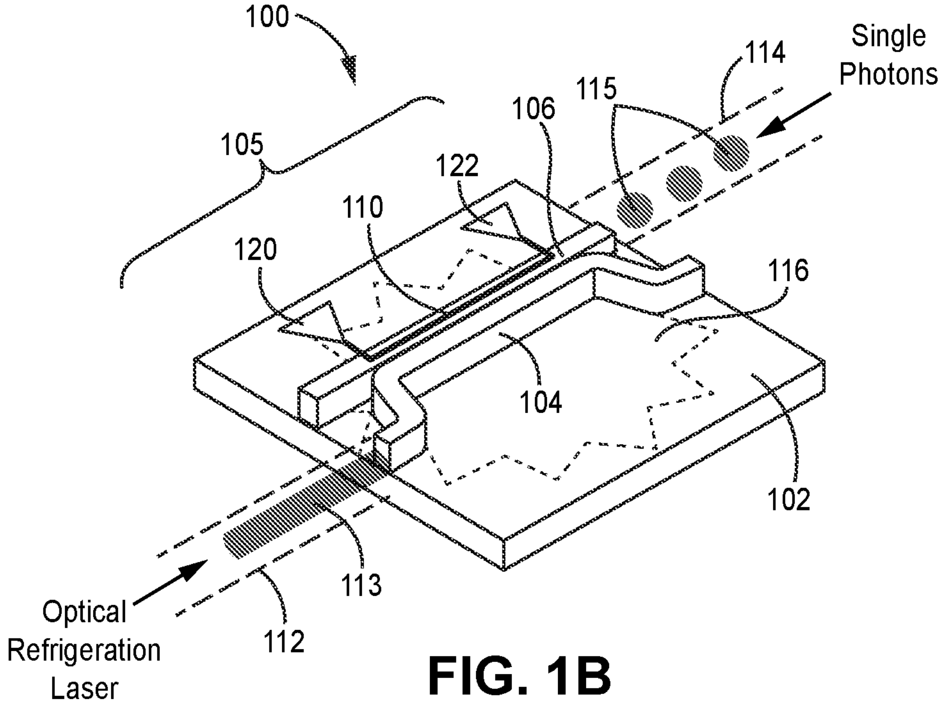
FIG. 1B is a schematic perspective view of the system of FIG. 1A, showing operation of the SNSPD by using laser cooling to generate the zone of local optical refrigeration.

FIGS. 1A and 1B illustrate one embodiment of a system for optical cooling, indicated generally at 100, which can be implemented for a superconducting nanowire single photon detector (SNSPD). This embodiment uses laser cooling (also known as optical refrigeration by fluorescence up-conversion) to generate a zone of local optical refrigeration such as a local cryogenic region.

System 100 includes a substrate 102 on which a first waveguide (cooling waveguide) 104, and a second waveguide (counting waveguide) 106 (also known more generically as a utility waveguide), are formed on substrate 102. In one embodiment, substrate 102 is formed of silicon. Also, it is understood that, in other embodiments, system 100 produces a zone of local optical refrigeration for a utility waveguide that can be used at a cryogenic temperature for purposes other than counting photons. Thus, it is understood that the present disclosure is not limited to use with SNSPDs.

Accordingly, other examples that can utilize the present approach include the cooling of waveguides in which thermal noise needs to be minimized, such as waveguide microresonators used as optical references in miniature atomic clocks, in which thermal energy in the waveguides leads to noise in the optical signals.

Cooling waveguide 104 and counting waveguide 106 are disposed such that counting waveguide 106 is adjacent to or coincident with cooling waveguide 104. Further, cooling waveguide 104 and counting waveguide 106 are separated by a reflective layer 108 which blocks cooling photons from reaching counting waveguide 106. In one embodiment, cooling waveguide 104 and counting waveguide 106 are disposed in a side-by-side relationship on a surface of substrate 102. In other embodiments, cooling waveguide 104 and counting waveguide 106 are fabricated in a vertical orientation with counting waveguide 106 formed on top of cooling waveguide 104. Cooling waveguide 104 can be composed of a thin film material suitable for supporting optical refrigeration, such as ultra-pure III-V semiconductor thin films. Examples of suitable III-V semiconductor materials include GaAs/InGaP films.

System 100 includes a single photon detector 105. Single photon detector 105 includes a nanowire 110, which can be composed of niobium nitride (NbN), and which is formed as a thin film on counting waveguide 106. Niobium nitride becomes a superconductor at about 7-12 K. To produce cryogenic temperatures in substrate 102 in a zone around counting waveguide 106 and nanowire 110, cooling waveguide 104 is coupled to a first optical fiber (cooling fiber) 112. Cooling fiber 112, in one example, is a single mode silica optical fiber. Single photon detector 105 also includes a second optical fiber (counting fiber) 114 that acts as a source of photons to be counted. In addition, single photon detector 105 further includes a pair of electrodes 120 and 122, such as gold pads, which are coupled to substrate 102. Each end of nanowire 110 is respectively connected to electrodes 120 and 122, which in turn are coupled to low noise electronics (not shown) used as a readout for single photon detector 105.

In some embodiments, substrate 102 is pre-cooled to below room temperature, while in other embodiments, substrate 102 is cooled by cooling fiber 112 and cooling waveguide 104 starting at room temperature. When used, the pre-cooling occurs in a steady state, such as would obtain if a photonic chip were in a cryogenic environment established by immersion in liquid nitrogen or liquid helium, or other related conventional cryogenic cooling methods.

In some embodiments, system 100 can be implemented as a photonic circuit based SNSPD, which utilizes direct, local cryogenic optical refrigeration of integrated waveguides. For example, substrate 102 can be part of a photonic integrated circuit that includes a SNSPD.

During operation, as shown in FIG. 1B, cooling fiber 112 transmits cooling light 113 (cooling photons) such as from an optical refrigeration laser into cooling waveguide 104. The interaction of cooling light 113 with cooling waveguide 104 produces a zone of local optical refrigeration 116 (e.g., local cryogenic region) based on fluorescence up-conversion, such that counting waveguide 106 is optically cooled by physical proximity to cooling waveguide 104. This causes nanowire 110 of single photon detector 105 to operate as a superconductor. For example, the local optical refrigeration temperature (T) can be reduced to below the transition temperature (Tc) of a superconducting material. Counting fiber 114 then launches single photons 115 into counting waveguide 106, and single photons 115 are counted by single photon detector 105, such as a SNSPD.

Figure 2:
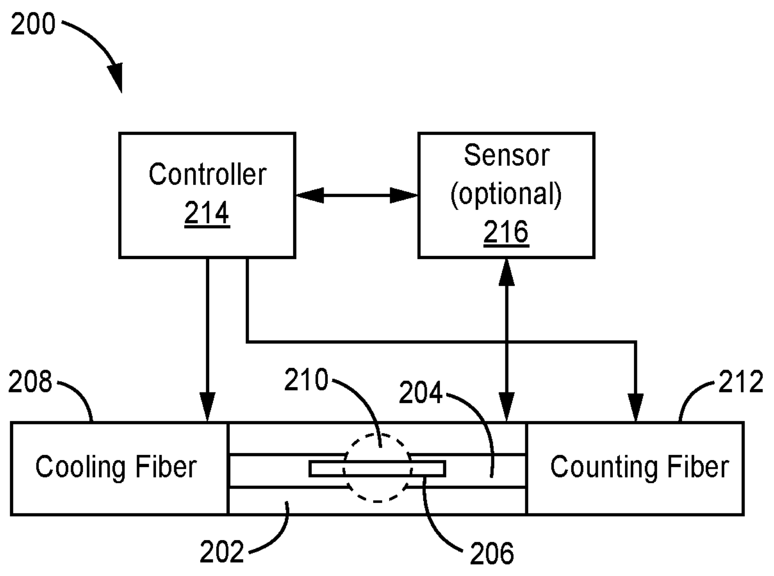
FIG. 2 is a block diagram of another embodiment of a system for generating a local cryogenic region to enable the operation of a single photon detector implemented with a waveguide shared between cooling and counting functions.

FIG. 2 is a block diagram of another embodiment of a system, indicated generally at 200, for generating a local cryogenic region 210 to enable the operation of a circuit 206. In one embodiment, circuit 206 is an SNSPD that includes an NbN nanowire. In other embodiments, circuit 206 is a circuit that requires one or more circuit components to be cooled to a cryogenic temperature for proper operation. For simplicity, system 200 will be described in terms of the SNSPD embodiment.

System 200 includes a substrate 202, and circuit 206 is fabricated on or in substrate 202. Additionally, a waveguide 204 is formed in or on substrate 202. Waveguide 204 is coupled to a cooling fiber 208 on one end and, in the case of a single photon detector, is coupled to a counting fiber 212 on the other end. To enable use of a single waveguide 204, in some embodiments, cooling light delivered into waveguide 204 by cooling fiber 208 is pulsed so as to create local cryogenic region 210 when needed for the operation of circuit 206 without interfering with the photons delivered into waveguide 204 by counting fiber 212. To this end, system 200 includes a controller 214 and a sensor 216. Controller 214 generates signals to turn on and off the source of photons (e.g., laser cooling light) for cooling fiber 208 and counting fiber 212 such that cooling fiber 208 and counting fiber 212 are not on at the same time. Additionally, sensor 216 provides feedback to indicate that local cryogenic region 210 has reached a sufficiently low temperature such that circuit 206 (e.g., NbN nanowire) is in a superconducting state based on electrical characteristics of circuit 206. In one embodiment, sensor 216 monitors an electrical characteristic of circuit 206 that indicates circuit 206 has reached a temperature at the desired state, e.g., near to or at the superconducting transition temperature Tc.

It is noted that sensor 216 is optional provided that cooling fiber 208 is able to achieve the local cryogenic region 210 for a sufficient amount of time and at a sufficiently low temperature open loop (without feedback control).

Alternatively, rather than operating system 200 in a pulse manner as described above, in other embodiments, wavelength selective optical filters such as fiber Bragg gratings, or non-reciprocal transmitters such as optical circulators, can be used to enable both cooling photons and counting photons to exist in waveguide 204 at the same time without cross coupling into the other fiber and causing interference. Fiber Bragg gratings are standard fiber optical components. The method by which these gratings reflect some light, and pass other light, based on wavelength, is well known to those skilled in the art.

Figure 3:
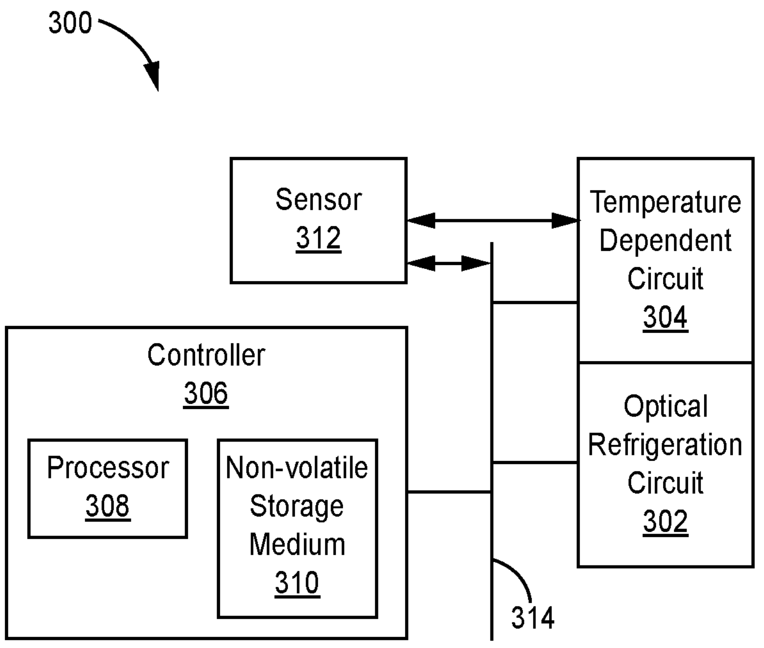
FIG. 3 is a block diagram of another embodiment of a system for generating a local cryogenic region to enable the operation of a circuit.

FIG. 3 is a block diagram of another embodiment of a system, indicated generally at 300, for generating a zone of local optical refrigeration such as a local cryogenic region, to enable the operation of a temperature-dependent circuit 304. In this embodiment, system 300 includes optical refrigeration circuit 302 that creates the zone of local optical refrigeration for temperature-dependent circuit 304. In one embodiment, optical refrigeration circuit 302 includes a source of laser cooling light such as a gated or shuttered laser source, and a waveguide for directing the laser cooling light to the intended zone of local optical refrigeration. In other embodiments, optical refrigeration circuit comprises other appropriate components that generate the zone of local optical refrigeration.

System 300 can use pulsed laser control in the creation of the zone of local optical refrigeration. Specifically, system 300 includes a controller 306 in operative communication with optical refrigeration circuit 302 and temperature-dependent circuit 304, such as through a bus arrangement 314. Controller 306 includes a processor 308 and a non-transitory, non-volatile storage medium 310. Processor 308 may be implemented using one or more processors, a field programmable gate array (FPGA), an application specific integrated circuit (ASIC), a controller, or other circuit used to execute instructions in an electronic circuit. The processor 308 can be implemented using software, firmware, hardware, or appropriate combinations thereof, for carrying out various process tasks, calculations, and control functions Non-volatile storage medium 310 can include any available storage media (or computer readable medium) that can be accessed by a general purpose or special purpose computer or processor, or any programmable logic device. Suitable computer readable media may include storage or memory media such as semiconductor, magnetic, and/or optical media, and may be embodied as a program product comprising instructions stored in non-transitory computer readable media, such as random access memory (RAM), read-only memory (ROM), non-volatile RAM, electrically-erasable programmable ROM, flash memory, or other storage media.

As described in more detail below, processor 308 executes instructions stored in non-volatile storage medium 310 to control the operation of optical refrigeration circuit 302 and temperature-dependent circuit 304. A sensor 312 is in operative communication with temperature-dependent circuit 304, optical refrigeration circuit 302, and controller 306, such as through bus arrangement 314. Processor 308 relies on data from sensor 312 in this pulsed control embodiment. Specifically, sensor 312 senses when an appropriate zone of local optical refrigeration has been created by optical refrigeration circuit 302 for temperature-dependent circuit 304. Sensor 312 reports the creation of the zone of local optical refrigeration to processor 308.

Processor 308 determines when to turn on optical refrigeration circuit 302 to create the zone of local optical refrigeration. Processor 308 uses data from sensor 312 to determine when to turn off optical refrigeration circuit 302. Thus, processor 308 is able to create a transient or intermittent zone of local refrigeration for temperature-dependent circuit 304, rather than requiring the entire circuit of temperature-dependent circuit 304 to be at a cryogenic temperature at all times.

Figure 4:
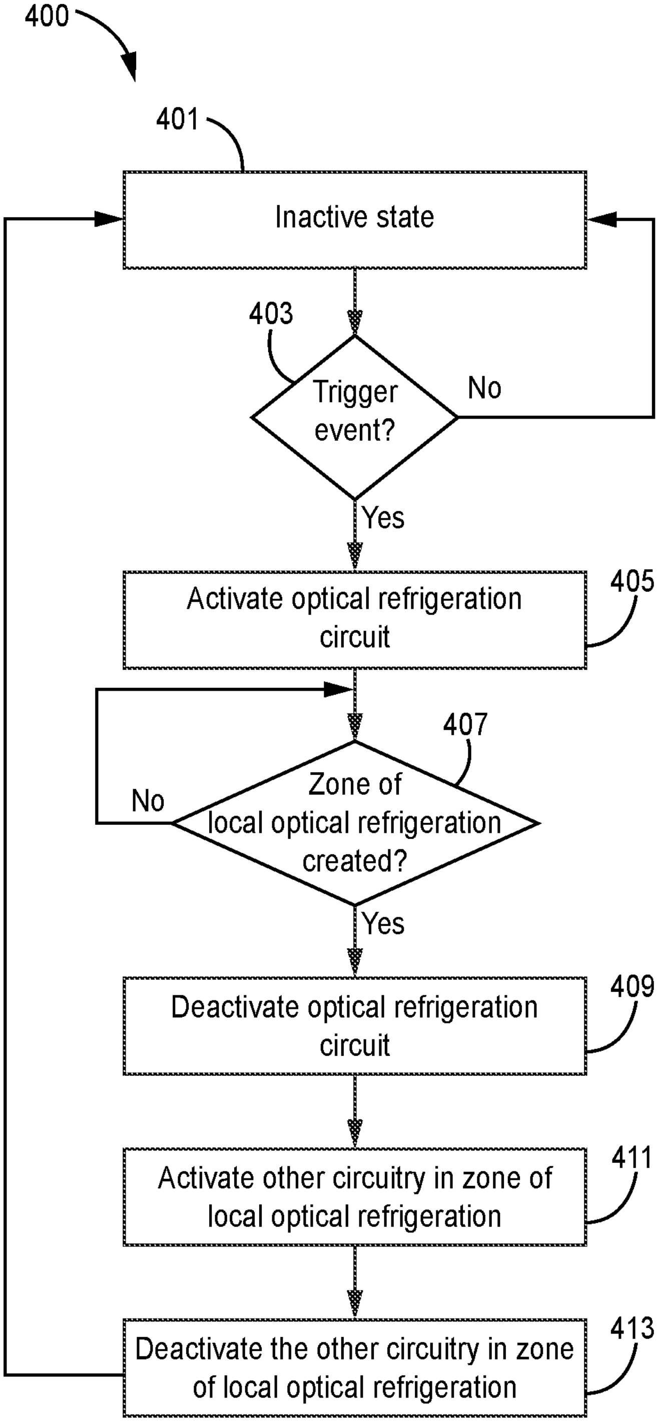
FIG. 4 is a flow diagram of one implementation of a process for using local cryogenic refrigeration to enable circuit operation.

FIG. 4 is a flow diagram of one implementation of a process, indicated generally at 400, for using local cryogenic refrigeration to enable circuit operation. Process 400 is described in conjunction with the embodiment of system 300 shown and described above with respect to FIG. 3. However, it is understood that process 400 is not limited to use with system 300 of FIG. 3 but can be used to provide pulsed control to a system that creates a zone of local optical refrigeration using cooling photons from an optical source to enable the operation of another circuit. For example, process 400 of FIG. 4 could also be used in conjunction with system 100 of FIGS. 1A-1B, or system 200 of FIG. 2, as well as other system architectures designed to provide a zone of local optical refrigeration to enable circuit operation.

Process 400 runs on processor 308 of controller 306 using instructions stored in non-volatile storage medium 310. Process 400 begins with a temperature-dependent circuit, such as temperature-dependent circuit 304, in an inactive state at block 401. At block 403, process 400 determines if a trigger event has occurred that requires the temperature-dependent circuit to be cooled to a cryogenic temperature. For example, a trigger event can be an electronic signal generated by a system controller that determines that cooling should initiate. The conditions that cause the sending of the trigger event can be a computer software routine executing a control program, or can be generated in response to a stimulus such as the detection of a light pulse or signal transmitted by another system. If a trigger event has not occurred, then process 400 returns to block 401. If a trigger event has occurred, then process 400 activates an optical refrigeration circuit, such as optical refrigeration circuit 302, at block 405.

At block 407, process 400 determines whether a zone of local optical refrigeration has been created such as for temperature-dependent circuit 304. In one embodiment, process 400 makes this determination based on feedback from sensor 312. For example, sensor 312 may monitor an electrical characteristic of temperature-dependent circuit 304 to determine if the characteristic has changed in such a way as to indicate that the zone of local optical refrigeration has reached a sufficiently low (cryogenic) temperature. If not, process 400 repeats at block 407.

When process 400 determines at block 407 that a zone of local optical refrigeration has been created, process 400 deactivates the optical refrigeration circuit, such as by deactivating a cooling laser of optical refrigeration circuit 302, at block 409. For example, the optical refrigeration circuit 302 can be deactivated when the zone of local optical refrigeration has a temperature below a user selected threshold, such as less than about 12 K. Further, process 400 activates other circuitry, such as temperature-dependent circuit 304, at block 411 to take advantage of the zone of local optical refrigeration. At block 413, process 400 deactivates the other circuitry, such as temperature-dependent circuit 304, in the zone of local optical refrigeration when operation is complete, and returns to block 401.

The methods described herein may be implemented by computer executable instructions, such as program modules or components, which are executed by at least one processor or processing unit. Generally, program modules include routines, programs, objects, data components, data structures, algorithms, and the like, which perform particular tasks or implement particular abstract data types. Instructions for carrying out the various process tasks, calculations, and generation of other data used in the operation of the methods described herein can be implemented in software, firmware, or other computer readable instructions.

EXAMPLE EMBODIMENTS

Example 1 includes a system for optical cooling, the system comprising: a substrate; a first waveguide supported by the substrate, the first waveguide configured to provide optical cooling by fluorescence up-conversion; a first optical fiber coupled to the first waveguide, the first optical fiber configured to deliver cooling light to the first waveguide; and a second waveguide supported by the substrate, the second waveguide adjacent to or coincident with the first waveguide; wherein an interaction of the cooling light with the first waveguide produces a zone of local optical refrigeration based on the fluorescence up-conversion, such that the second waveguide is optically cooled by physical proximity to the first waveguide.

Example 2 includes the system of Example 1, further comprising: a single photon detector supported by the substrate, the single photon detector including a nanowire on the second waveguide; and a second optical fiber coupled to the second waveguide, the second optical fiber configured to launch single photons into the second waveguide; wherein the interaction of the cooling light with the first waveguide to produce the zone of local optical refrigeration causes the nanowire of the single photon detector to operate as a superconductor, such that the single photons launched into the second waveguide are counted by the single photon detector.

Example 3 includes the system of Example 2, wherein the first waveguide and the second waveguide are separated by a reflective layer that blocks cooling photons of the cooling light from reaching the second waveguide.

Example 4 includes the system of any of Examples 1-3, wherein the first waveguide and the second waveguide are disposed in a side-by-side relationship on the substrate.

Example 5 includes the system of any of Examples 1-3, wherein the first waveguide and the second waveguide are disposed in a vertical orientation on the substrate, with the second waveguide over the first waveguide.

Example 6 includes the system of any of Examples 1-5, wherein the first waveguide and the second waveguide are composed of a thin film material supported by the substrate, the thin film material comprising a III-V semiconductor material.

Example 7 includes the system of any of Examples 1-6, wherein the substrate is part of a photonic integrated circuit that includes a superconducting nanowire single photon detector (SNSPD).

Example 8 includes the system of Example 7, wherein the SNSPD includes a nanowire composed of niobium nitride.

Example 9 includes the system of any of Examples 1-8, wherein the zone of local optical refrigeration comprises a local cryogenic region in the substrate, around the first and second waveguides.

Example 10 includes the system of any of Examples 1-9, wherein the cooling light is provided by a pulsed control laser through the first optical fiber to the first waveguide to produce the zone of local optical refrigeration.

Example 11 includes a system comprising: a temperature-dependent circuit; an optical refrigeration circuit in thermal communication with the temperature-dependent circuit, the optical refrigeration circuit configured to create a zone of local optical refrigeration for the temperature-dependent circuit; and a controller in operative communication with the optical refrigeration circuit and the temperature-dependent circuit, the controller including a processor and a storage medium; wherein the processor is operative to execute instructions, stored in the storage medium, to perform a method comprising: activating the optical refrigeration circuit when a trigger event occurs, to create the zone of local optical refrigeration for the temperature-dependent circuit; deactivating the optical refrigeration circuit when the zone of local optical refrigeration has a temperature below a user selected threshold; and operating the temperature-dependent circuit while the temperature for the zone of local optical refrigeration is below the user selected threshold.

Example 12 includes the system of Example 11, further comprising a sensor in operative communication with the temperature-dependent circuit, the optical refrigeration circuit and the controller.

Example 13 includes the system of Example 12, wherein the sensor is operative to determine when the temperature in the zone of local optical refrigeration is below the user selected threshold.

Example 14 includes the system of any of Examples 12-13, wherein the sensor is configured to monitor an electrical characteristic of the temperature-dependent circuit to determine if the electrical characteristic has changed so as to indicate that the zone of local optical refrigeration has reached a cryogenic temperature.

Example 15 includes the system of any of Examples 12-14, wherein the sensor is configured to provide feedback to the controller indicating when the zone of local optical refrigeration has reached a sufficiently low temperature such that the temperature-dependent circuit is in a superconducting state.

Example 16 includes the system of any of Examples 11-15, wherein the optical refrigeration circuit includes a cooling optical fiber coupled to a first end of a waveguide, the cooling optical fiber configured to deliver laser cooling light to the waveguide to create the zone of local optical refrigeration.

Example 17 includes the system of Example 16, wherein the temperature-dependent circuit includes a counting optical fiber coupled to a second end of the waveguide, the counting optical fiber configured to launch single photons into the waveguide.

Example 18 includes the system of any of Examples 11-17, wherein the temperature-dependent circuit includes a superconducting nanowire single photon detector (SNSPD).

Example 19 includes the method of any of Examples 16-18, wherein the laser cooling light is delivered by a pulsed control laser through the cooling optical fiber to the waveguide to create the zone of local optical refrigeration.

Example 20 includes a method comprising: providing an optical refrigeration circuit in thermal communication with a temperature-dependent circuit; activating delivery of a cooling light to a waveguide in the optical refrigeration circuit when a trigger event occurs to create a zone of optical refrigeration for the temperature-dependent circuit; deactivating the delivery of the cooling light to the optical refrigeration circuit when the zone of optical refrigeration has a temperature below a user selected threshold; and operating the temperature-dependent circuit while the temperature for the zone of optical refrigeration is below the user selected threshold.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A system for optical cooling, the system comprising:

a substrate;

a first waveguide supported by the substrate, the first waveguide configured to provide optical cooling by fluorescence up-conversion;

a first optical fiber coupled to the first waveguide, the first optical fiber configured to deliver cooling light to the first waveguide; and a second waveguide supported by the substrate, the second waveguide adjacent to or coincident with the first waveguide;

wherein the substrate is part of a photonic integrated circuit that includes a superconducting nanowire single photon detector (SNSPD);

wherein an interaction of the cooling light with the first waveguide produces a zone of local optical refrigeration based on the fluorescence up-conversion, such that the second waveguide is optically cooled by physical proximity to the first waveguide.

2. The system of claim 1, wherein the first waveguide and the second waveguide are separated by a reflective layer that blocks cooling photons of the cooling light from reaching the second waveguide.

3. The system of claim 1, wherein the first waveguide and the second waveguide are disposed in a side-by-side relationship on the substrate.

4. The system of claim 1, wherein the first waveguide and the second waveguide are disposed in a vertical orientation on the substrate, with the second waveguide over the first waveguide.

5. The system of claim 1, wherein the first waveguide and the second waveguide are composed of a thin film material supported by the substrate, the thin film material comprising a III-V semiconductor material.

6. The system of claim 1, wherein the SNSPD includes a nanowire composed of niobium nitride.

7. The system of claim 1, wherein the zone of local optical refrigeration comprises a local cryogenic region in the substrate, around the first and second waveguides.

8. The system of claim 1, wherein the cooling light is provided by a pulsed control laser through the first optical fiber to the first waveguide to produce the zone of local optical refrigeration.

9. A system for optical cooling, the system comprising:

a substrate;

a first waveguide supported by the substrate, the first waveguide configured to provide optical cooling by fluorescence up-conversion;

a first optical fiber coupled to the first waveguide, the first optical fiber configured to deliver cooling light to the first waveguide;

a second waveguide supported by the substrate, the second waveguide adjacent to or coincident with the first waveguide;

a single photon detector supported by the substrate, the single photon detector including a nanowire on the second waveguide; and a second optical fiber coupled to the second waveguide, the second optical fiber configured to launch single photons into the second waveguide;

wherein an interaction of the cooling light with the first waveguide produces a zone of local optical refrigeration based on the fluorescence up-conversion, such that the second waveguide is optically cooled by physical proximity to the first waveguide;

wherein the interaction of the cooling light with the first waveguide to produce the zone of local optical refrigeration causes the nanowire of the single photon detector to operate as a superconductor, such that the single photons launched into the second waveguide are counted by the single photon detector.

10. The system of claim 9, wherein the first waveguide and the second waveguide are separated by a reflective layer that blocks cooling photons of the cooling light from reaching the second waveguide.

11. The system of claim 9, wherein the first waveguide and the second waveguide are composed of a thin film material supported by the substrate, the thin film material comprising a III-V semiconductor material.

12. The system of claim 9, wherein the zone of local optical refrigeration comprises a local cryogenic region in the substrate, around the first and second waveguides.

13. The system of claim 9, wherein the cooling light is provided by a pulsed control laser through the first optical fiber to the first waveguide to produce the zone of local optical refrigeration.

* * * * *